United States Patent
Leighton et al.

[11] Patent Number: 5,869,897
[45] Date of Patent: Feb. 9, 1999

[54] MOUNTING ARRANGEMENT FOR SECURING AN INTERGRATED CIRCUIT PACKAGE TO HEAT SINK

[75] Inventors: Larry C. Leighton, Santa Cruz; Thomas W. Moller, Gilroy, both of Calif.; Bengt Ahl, Gavle, Sweden

[73] Assignee: Ericcson, Inc., Morgan Hill, Calif.

[21] Appl. No.: 956,193

[22] Filed: Oct. 22, 1997

[51] Int. Cl.[6] .............................. H05K 7/00; H05K 7/20; H01L 23/00
[52] U.S. Cl. ........................ 257/727; 257/718; 257/714; 257/726; 257/732
[58] Field of Search .................................. 257/710, 718, 257/727, 704, 726, 732, 730

[56] References Cited

U.S. PATENT DOCUMENTS

| | | | |
|---|---|---|---|
| 5,345,107 | 9/1994 | Daikoku et al. | 257/717 |
| 5,641,976 | 6/1997 | Taguchi et al. | 257/727 |
| 5,648,893 | 7/1997 | Loo et al. | 257/727 |

*Primary Examiner*—Peter Toby Brown
*Assistant Examiner*—Hung Van Duong
*Attorney, Agent, or Firm*—Lyon & Lyon LLP

[57] ABSTRACT

A top surface of a protective cover of an IC component package is provided with a centered-protrusion, e.g., such as a cylindrical peg, that extends above the cover. A retaining-spring is formed by twisting a resilient (e.g., metal) metal strip into a ribbon-like shape having opposing ends that extend from a curvelinear bottom surface. The bottom surface of the retaining-spring is provided with an opening configured to mate with the centered protrusion on the package cover, such that the opposing ends of the retaining-spring extend away from the package cover at substantially the same, albeit reverse angles. In order to mount the IC package to a heat sink, the bottom surface of the retaining-spring may be compressively mated onto the package cover at the same time the package is inserted between two substantially parallel walls protruding from the heat sink surface, wherein the walls are distanced from each other. just so as to cause moderate compression of the opposing ends of the spring toward each other as the package is inserted against the heat sink surface. The opposing surfaces of the two walls are provided with a plurality of notches formed substantially parallel to the heat sink surface in a "ratchet-type" relief pattern, such that the opposing ends of the retaining-spring are held into place by respective notches, once the IC package is secured against the heat sink.

13 Claims, 4 Drawing Sheets

MOUNTING ARRANGEMENT FOR SECURING AN INTERGRATED CIRCUIT PACKAGE TO HEAT SINK

FIELD OF THE INVENTION

The present invention pertains to the field of integrated circuit packages and, in particular, to mounting arrangements for securing an integrated circuit package to a heat sink.

BACKGROUND

Integrated circuits ("ICs") have many uses in industries ranging from communications to consumer electronics. To this end, various types of ICs are commonly designed for use in conjunction with other circuit components mounted on a common printed circuit ("PC") board.

By way of example, a power transistor IC is formed by fabricating one or more transistor cells on a silicon wafer, commonly referred to as a transistor "chip". The transistor chip is attached to an insulating layer, normally a ceramic substrate, which is thermally, but not electrically, conductive. The ceramic substrate is itself attached to a thermally conductive mounting flange. A protective cover is secured to the flange, covering the substrate and transistor chip, thereby forming a power transistor "package."

Various electrically conductive (e.g., thin metal) leads may be attached to, and extend away from, the power transistor package (i.e., extending outside the protective cover) to connect common terminals of the transistor chip to external circuit elements. For example, for a bipolar junction type power transistor, respective electrical leads attached to the package are connected to a base, emitter and collector of the transistor chip.

Finished IC component packages are typically mounted on a PC board as part of an assembly process. Because most IC packages, and in particular power transistor packages, generate a significant amount of heat during operation, the bottom surface of the package mounting flange is typically affixed to a heat sink located beneath the surface of the PC board. For example, a single layer PC board—i.e., where there is a single layer of dielectric material between respective top and bottom surfaces of the PC board,—typically has a metallic bottom surface that is connected with screws or solder to a metallic heat sink surface used to mount one or more IC packages, wherein various surface leads on the PC board are thereafter connected to respective leads extending from the package, e.g., by a solder lead or a clamp.

There are several known techniques for securing an IC package to a heat sink surface. For example, as illustrated in FIG. 1A, an exemplary IC package 20 may be secured to a heat sink 22 by a screw 24 located on each end of a mounting flange 26. However mounting arrangement requires a manual step in the PC board assembly process, which adds considerable cost. Further, it is difficult to apply a uniform force across the entire bottom surface of the mounting flange 26 with the screws 24, which tend to exert greater force at the screw locations than over the rest of the flange bottom.

Referring to FIG. 1B, another common technique is to solder (or glue) the mounting flange 26 to the heat sink surface 22. While this process is more easily automated, the solder or bonding material 28 will invariably have a different thermal expansion coefficient than the respective (typically metal) mounting flange 26 and heat sink 22. As a result, the bond between the mounting flange 26 and heat sink 22 will weaken or even be destroyed by the thermal expansion stress between the respective layers, especially when subjected to repeated changes in temperature during each use of the IC package 20. Further, the presence of the intervening bonding material layer 28 may lessen the effectiveness of the heat conduction between the flange 26 and heat sink 22. A still further disadvantage with this approach is that, in order to remove an IC package for repair or replacement, the entire heat sink surface must be heated to break the solder bond, thereby causing all other solder bonds on the same heat sink to be weakened.

In particular, it is very desirable that a uniform force be applied across the bottom surface of the mounting flange 26 for the most efficient conduction of heat to the heat sink 22. Further, because the greatest amount of heat will typically flow through the center area of the package and mounting flange, i.e., below the active transistor cell area, it is desirable to apply the greatest force against the heat sink 22 in the center of the package 20.

To this end, as seen in FIGS. 1C and 1D, still another known IC package mounting arrangement involves the use of one or more screws 30 inserted into, and protruding above, the surface of the heat sink 22. A resilient metal strip 32 is extended from the screw(s) 30 and is shaped so as to apply a clamping force upon the cover of the IC package 20, thereby distributing a substantially centered force that "secures" the mounting flange 26 against the heat sink 22. However, this approach still requires the use of a labor intensive step in the PC board assembly process.

Thus, it would be desirable to provide an improved mounting arrangement for securing an IC component package to a heat sink, such as a heat sink attached to a bottom of a PC board, whereby a substantially uniform pressure is exerted for highest heat transfer efficiency, while still allowing for automated PC board assembly.

SUMMARY OF THE INVENTION

The present invention provides an improved mounting arrangement for securing an IC component package to a heat sink surface in a way that exerts a constant, uniform force through the center of the package against the heat sink, while readily lending itself to automated assembly processes.

In an exemplary preferred embodiment, a top surface of a protective cover of an IC component package is provided with a centered-protrusion, e.g., such as a cylindrical peg, that extends above the cover. A resilient spring is formed by twisting a metal strip into a ribbon-like shape having opposing ends that extend away from a "curvelinear" bottom portion. The bottom surface of the ribbon-shaped spring is provided with an opening configured to mate with the centered protrusion on the package cover, such that the opposing ends of the spring extend away from the cover at substantially similar, reverse angles with respect to the top of the package cover.

In order to mount the IC package to a heat sink, the opening in the bottom of the ribbon-shaped spring is compressively mated onto the centered protrusion of the package cover, as the package is simultaneously inserted between two substantially parallel walls protruding from the heat sink. The walls are distanced from each other so as to moderately compress the opposing ends of the spring inward (i.e., toward each other) as the bottom surface of the package is inserted against the heat sink. This compression causes the spring to apply a "downward" force against the top surface of the package cover, thereby securing the bottom surface of the package against the heat sink in a manner providing for good thermal contact.

The opposing (i.e., facing) surfaces of the two walls are each provided with one or more evenly spaced notches extending substantially parallel to the surface of the heat sink in a "ratchet-type" relief pattern. In this manner, the respective opposing ends of the spring are held into place, once the bottom surface of the package is firmly pressed against the heat sink. An advantage of this method for securing the package against the heat sink is that thermal expansion forces will not have any impact on the bond between the two.

Also, because the mounting assembly process can be achieved without the use of special tools (e.g., without screws or soldering), the process is easily automated. Further, the resilient nature of the ribbon-shaped spring allows the IC package to be easily removed from the heat sink by simply compressing the ends of the spring out of their respective retaining notches.

As will be apparent to those skilled in the art, other and further objects and advantages will appear hereinafter.

BRIEF DESCRIPTION OF THE DRAWINGS

The drawings illustrate both the design and utility of the present invention, in which similar elements in different embodiments are referred to by the same reference numbers for purposes of ease in illustration, in which.

DETAILED DESCRIPTION OF THE PREFERRED EMBODIMENTS

Figure 1A:
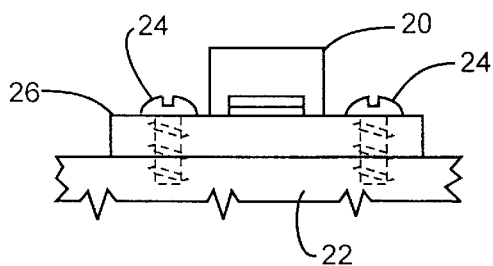
FIG. 1A is a partial cut-away side view of a first prior art mounting arrangement, wherein mounting screws are employed for directly attaching an IC package to a heat sink.
Figure 1B:
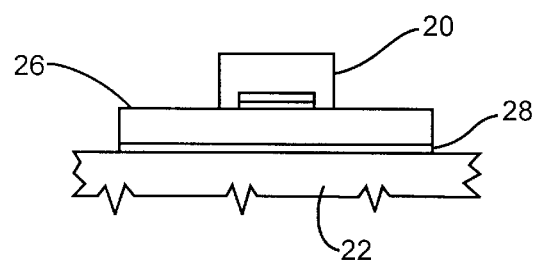
FIG. 1B is a side view of a second prior art mounting arrangement, wherein an IC package is soldered or otherwise bonded to a heat sink.
Figure 1C:
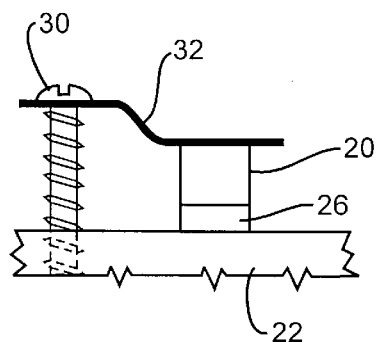
FIG. 1C is a side view of a third prior art mounting arrangement, wherein a single retaining screw and retaining strip extending therefrom are used to secure an IC package to a heat sink.
Figure 1D:
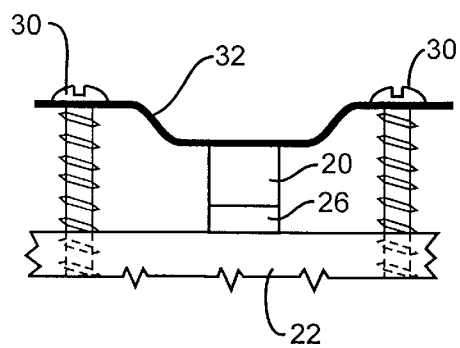
FIG. 1D is an side view of a fourth prior art mounting arrangement, wherein a pair of retaining screws and a retaining strip extended therebetween are used to secure an IC package to a heat sink.
Figure 2:
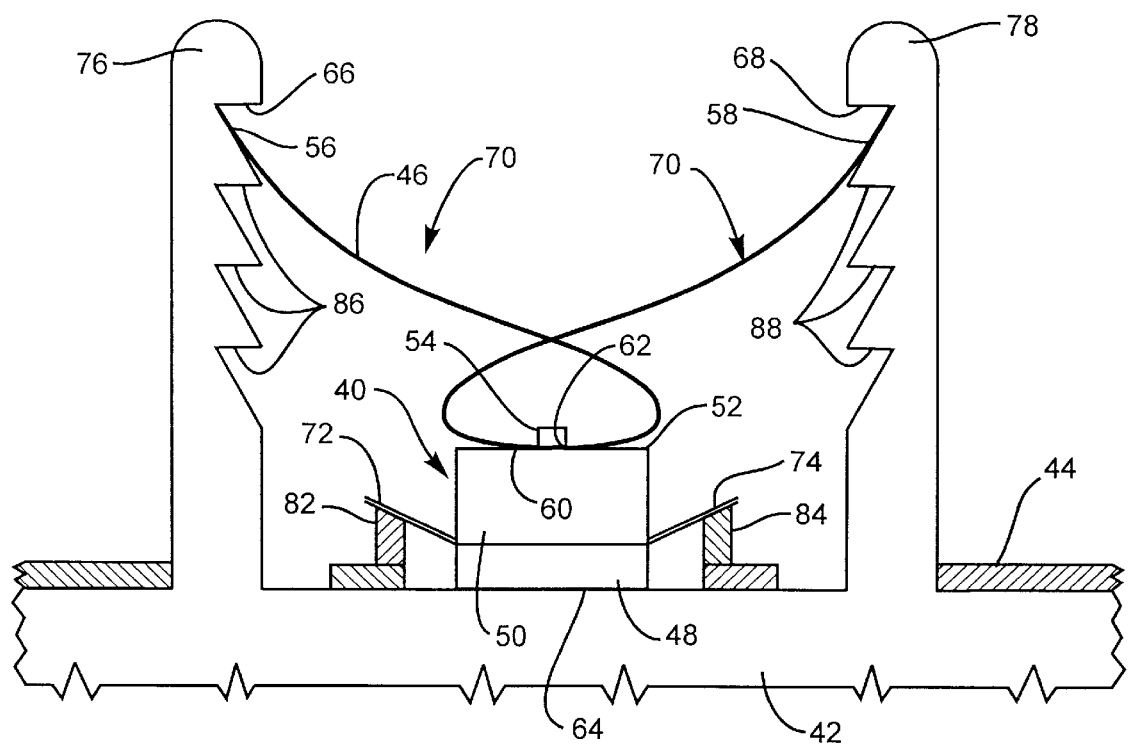
FIG. 2 is a partial cut-away side view of a preferred arrangement for mounting an IC package to a heat sink in accordance with the present invention, wherein the package is secured by a resilient, ribbon-shaped retaining-spring affixed to the center of the protective cover of the package and held in place by a pair of opposing walls protruding from the heat sink.

FIG. 2 illustrates a preferred arrangement for mounting an IC package 40 to a heat sink 42 located beneath a PC board surface 44, wherein the package 40 is secured to the heat sink 42 by a resilient, ribbon-shaped retaining-spring 46.

For simplicity, the illustrated package 40 will generally include an IC chip attached to a substrate (not shown) mounted on a thermally conductive flange 48, wherein a protective cover 50 is affixed to the flange 48 in a manner covering the substrate. A top surface 52 of the protective cover 50 is provided with a cylindrical peg 54, that is centered in the middle of the top surface 52, and extends away from the package 40.

The retaining-spring 46 has a generally ribbon-like shape with opposing ends 56 and 58 that extend away from a "curvelinear" bottom portion 60. In particular, the bottom portion 60 of the retaining-spring 46 is provided with a generally circular aperture 62 configured to mate with the centered cylindrical peg 54, such that the opposing ends 56 and 58 extend away from the top surface 52 of the package cover 50 at substantially similar, albeit reverse angles.

The opposing ends 56 and 58 of the retaining-spring 46 are retained at their distal extremities by respective notches 66 and 68, which are formed in opposing faces of a pair of substantially parallel walls 76 and 78 protruding outward from the surface of the heat sink 42. In particular, the respective notches 66 and 68 are formed substantially parallel to the surface of the heat sink 42, and the walls 76 and 78 are advantageously distanced from each other, such that the notches 66 and 68 cause the ends 56 and 58 of the retaining-spring 46 to be inwardly compressed, as indicated by arrows 70 in FIG. 2.

As will be appreciated by those skilled in the art, this inward compression of the spring ends 56 and 58 causes the bottom portion 60 of the retaining-spring 46 to apply a "downward" force against the top surface 52 of the package cover 50, thereby securing the bottom surface 64 of the flange 48 against the heat sink 42. A significant advantage of this method for securing the IC package 40 against the heat sink 42 is that it allows for differences in thermal expansion coefficients between the heat sink 42 and mounting flange 48, without impacting the thermal contact bond between the two pieces.

The opposing surfaces of walls 76 and 78 are preferably each provided with multiple further notches 86 and 88, respectively, extending in evenly spaced rows that are disposed substantially parallel to the surface of the heat sink 42, thereby forming a "ratchet-type" relief pattern in each wall 76 and 78. In this manner, the respective opposing ends 56 and 58 of the retaining-spring 46 may be variably compressed and retained to apply varying amounts of force against the top surface 52 of the package cover 50.

Preferably, the opposing ends 56 and 58 of the retaining-spring 46 are compressed to an extent that the force applied against the top surface 52 of the package cover 50 is sufficient to provide for both good thermal contact between the bottom surface of the flange 64 and the heat sink 42, and to provide for solid electrical contact between electrical leads 72 and 74 extending from the package 40 and a pair of respective electrical contacts 82 and 84 located on a portion of the PC board surface 44 extending between the respective heat sink walls 76 and 78. As will be noted by those skilled in the art, the respective electrical contacts 82 and 84 are shown in a greatly exaggerated proportion in FIGS. 2 and 6, for ease in illustration.

Figure 3:
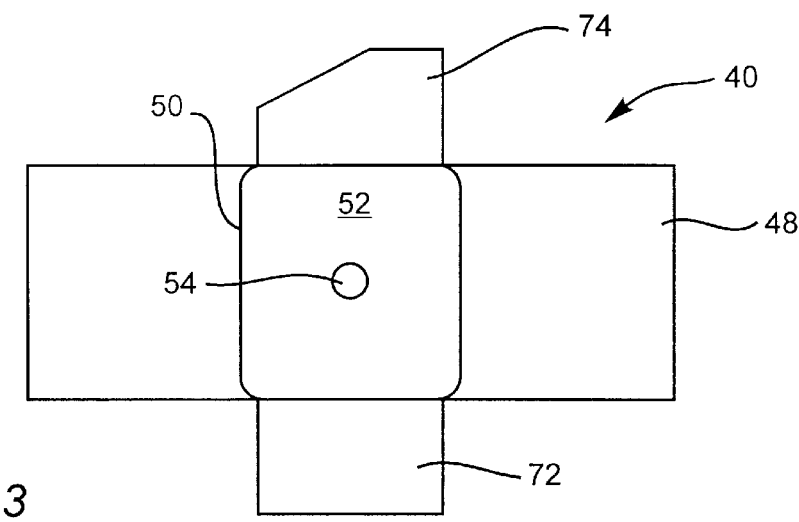
FIG. 3 is a top view of the transistor package of FIG. 2.

Referring to FIG. 3, in order to ensure that the force applied by the retaining-spring 46 to the package 40 is advantageously centered, the peg 54 is preferably centered with respect to the top surface of the cover 52.

Figure 4:
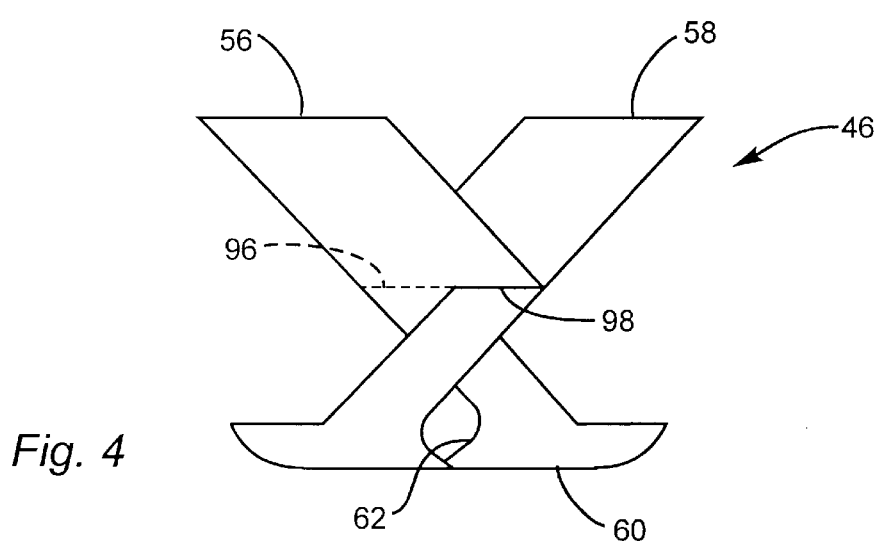
FIG. 4 is a perspective elevation of the retaining-spring of FIG. 2.
Figure 5:
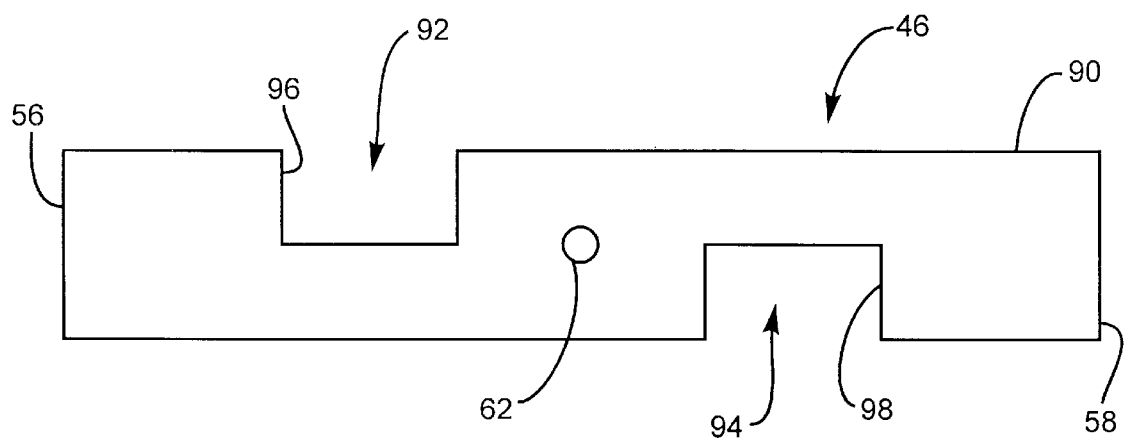
FIG. 5 is a top view of the retaining-spring of FIG. 4, shown in an "unfolded" position.

Referring to FIGS. 4 and 5, in accordance with a more specific aspect of the invention, the retaining-spring 46 may be formed from a resilient strip, such as, e.g., stainless steel. To form the preferred "ribbon-like" shape, a pair of rectangular cut-out portions 92 and 94 are cut into opposite ends/sides of the strip 90. The ends 56 and 58 of the strip 90 are then folded toward each other, with a slight relative twisting such that the rectangular cut-out portions 92 and 94 are "slotted" into each other. As will be appreciated by those skilled in the art, the resilient nature of the metal strip 90 causes respective outer edges 96 and 98 of the rectangular cut-out portions 92 and 84 to thereby retain the strip 90 in a ribbon-like shape (best seen in FIG. 4).

Figure 6:
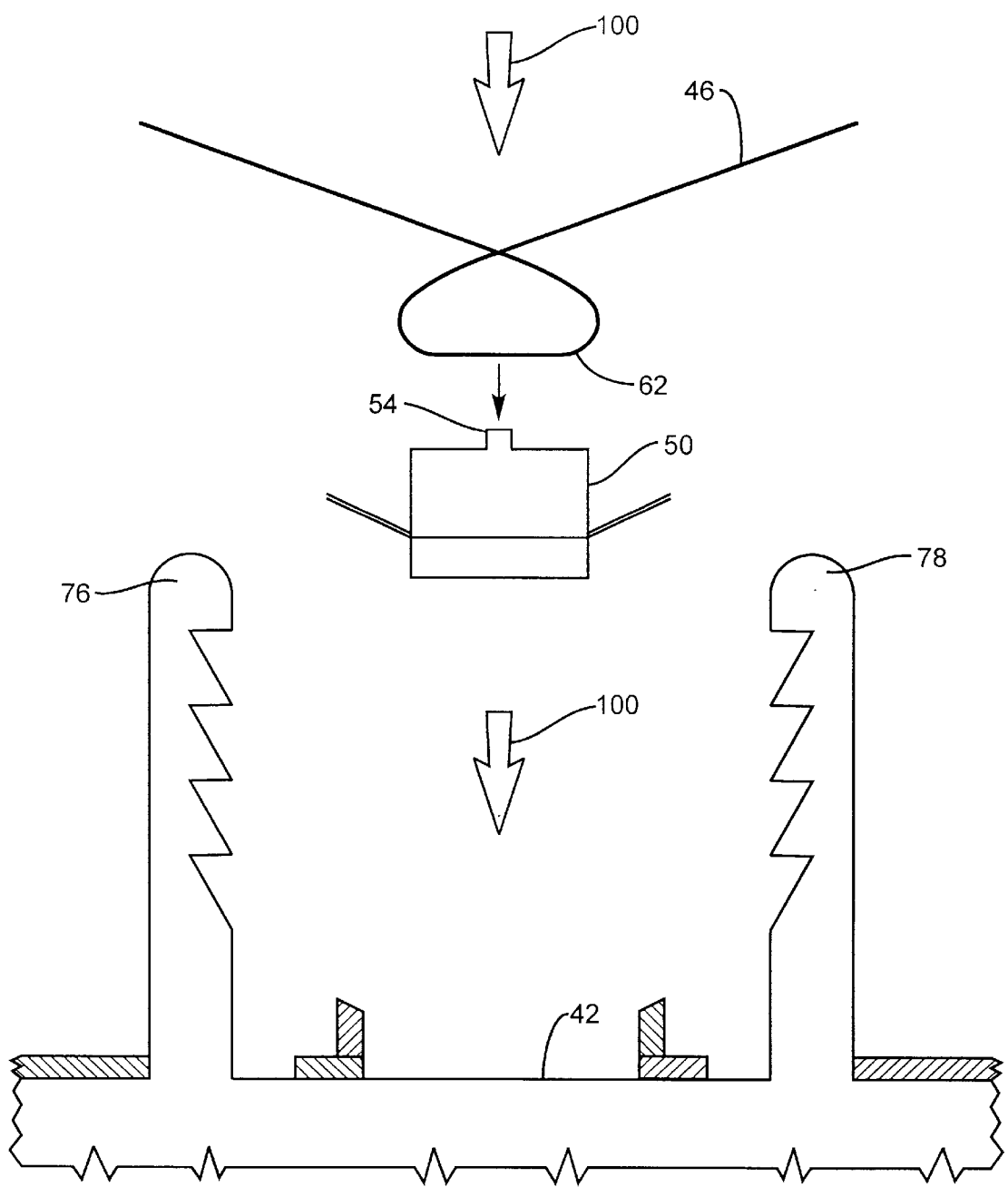
FIG. 6 is a partial cut-away side view illustrating a preferred assembly process for the mounting arrangement of FIG. 2.

As will further be appreciated by those skilled in the art, because the mounting assembly process can be achieved without the use of special tools (e.g., without screws or soldering), the process is easily automated. By way of example, an exemplary preferred assembly process for assembling the mounting arrangement of FIG. 2 is depicted in FIG. 6, whereby the IC package 40 and retaining-spring 46 may be introduced as separate elements in the assembly process, as indicated by the arrows 100. In particular, the aperture 62 in the bottom surface of the retaining-spring 46 may be compressively mated onto the centered peg 54 of the package cover 50 as the package is simultaneously inserted between the walls of the heat sink 42. Alternately, the retaining-spring 46 may be attached to the IC package cover 50 as a separate step—i.e., prior to the attachment of the IC package 40 to the heat sink 42.

As will still further be appreciated by those skilled in the art, the resilient nature of the retaining-spring 46 allows the IC package 40 to be easily removed from the heat sink 42, by simply compressing the ends 56 and 58 of the retaining-spring 46 out of their respective retaining notches 66 and 68, e.g., with a pair of suitable grips or pliers.

Thus, preferred embodiments have been disclosed of an improved arrangement for mounting a transistor package to a heat sink, such as a heat sink attached to a PC board. While embodiments and applications of this invention have been shown and described, as would be apparent to those skilled in the art, many more modifications and applications are possible without departing from the inventive concepts herein.

By way of example, in the above-described preferred embodiment, the package cover 50 is shown and described as having a "male" fitting (i.e., peg 52) for seating a "female" fitting (i.e., the hole 62) in the bottom portion 60 of the retaining-spring 46. It will be readily apparent to those skilled in the art that many variations to this configuration are possible. For example, an IC package cover may alternately be formed with an inward indentation, or well, which mates or otherwise generally contains a protrusion of a retaining-spring member.

The scope of the inventions, therefore, are not to be restricted except in the spirit of the appended claims.

What is claimed:

1. An integrated circuit package, comprising:
    a mounting flange;
    a semiconductor substrate attached to a surface of the mounting flange; and
    a cover secured to the mounting flange surface, the cover substantially covering the semiconductor substrate and having an exterior surface configured to seat a retaining-spring.

2. The integrated circuit package of claim 1, wherein the exterior surface of the cover piece has a substantially cylindrical peg protruding therefrom.

3. In combination, an integrated circuit package and a retaining-spring, the integrated circuit package comprising
    a mounting flange,
    a semiconductor substrate attached to a surface of the mounting flange, and
    a cover secured to the mounting flange surface, the cover substantially covering the semiconductor substrate and having an exterior surface configured to seat a retaining-spring.

4. The combination of claim 3, wherein the retaining-spring comprises a resilient strip with first and second opposing ends, wherein the resilient strip is twisted so that the first and second opposing ends extend upward and away from each other thereby defining a curvelinear bottom surface, whereby the retaining-spring secures the integrated circuit package to a heat transfer surface.

5. The combination of claim 4, wherein the exterior surface of the cover piece has a substantially cylindrical peg protruding therefrom.

6. The combination of claim 5, wherein the bottom surface of the retaining-spring comprises an aperture configured to mate with the substantially cylindrical peg.

7. A PC board assembly, comprising:
    a heat sink; and
    an integrated circuit package secured to a heat sink by a retaining-spring, the integrated circuit package comprising
    a mounting flange,
    a semiconductor substrate attached to a first surface of the mounting flange, and
    a cover secured to the first mounting flange surface, the cover substantially covering the semiconductor substrate and having an exterior surface configured for seating the retaining-spring.

8. The PC board assembly of claim 7, wherein the heat sink comprises a surface having a pair of substantially parallel walls protruding therefrom, the walls having opposing sides, each respective opposing wall side having a groove formed therein that extends substantially parallel to the heat sink surface.

9. The PC board assembly of claim 8, wherein each respective opposing wall side comprises a plurality of grooves that form a ratchet-type relief pattern.

10. The PC board assembly of claim 8, the retaining-spring comprising a resilient strip with first and second opposing ends, wherein the resilient strip is twisted so that the first and second opposing ends extend upward and away from each other thereby defining a curvelinear bottom surface, wherein the first and second opposing ends of the retaining-spring are restrained by the respective grooves formed in the opposing wall sides in a manner such that the bottom surface of the retaining-spring applies a compressive force against the exterior surface of the IC package cover piece, thereby securing a second surface of the mounting flange against the heat sink surface.

11. The PC board assembly of claim 10, wherein the compressive force applied by the retaining-spring on the IC package causes a lead extending from the IC package to make electrical contact with a conductive contact element located on the PC board.

12. The PC board assembly of claim 7, wherein the retaining-spring comprises a resilient strip with first and second opposing ends, wherein the resilient strip is twisted so that the first and second opposing ends extend upward and away from each other thereby defining a curvelinear bottom surface.

13. The PC board assembly of claim 12, wherein the exterior surface of the cover piece has a substantially cylindrical peg protruding therefrom and mating with an aperture in the bottom surface of the retaining-spring.

* * * * *